(12) United States Patent
Senuma

(10) Patent No.: US 6,198,599 B1
(45) Date of Patent: Mar. 6, 2001

(54) MAGNETIC HEAD WITH BONDED BALLS HAVING A CAPILLARY MARK

(75) Inventor: Masamitsu Senuma, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/227,999

(22) Filed: Jan. 8, 1999

(30) Foreign Application Priority Data

Dec. 4, 1998 (JP) .................................................. 10-345072

(51) Int. Cl.⁷ ...................................................... G11B 5/48
(52) U.S. Cl. .................. 360/234.5; 228/180.22; 228/111.5; 228/110.1
(58) Field of Search ........................... 228/110.1, 180.21, 228/180.22, 111.5; 29/603.06, 603.01; 360/234.5

(56) References Cited

U.S. PATENT DOCUMENTS

| | | | |
|---|---|---|---|
| 3,357,090 | 12/1967 | Tiffany | ..................................... 29/470 |
| 4,442,967 | 4/1984 | van de Pas et al. | ................. 228/159 |
| 5,657,186 | * | 8/1997 | Kudo et al. ........................... 360/104 |
| 5,821,494 | * | 10/1998 | Albrecht et al. ................. 219/121.64 |
| 5,864,445 | * | 1/1999 | Bennin et al. ........................ 360/104 |
| 5,901,014 | * | 5/1999 | Hiraoka et al. ...................... 360/104 |
| 6,002,550 | * | 12/1999 | Amemiya et al. ................... 360/104 |

* cited by examiner

*Primary Examiner*—Geoffrey S. Evans
*Assistant Examiner*—M. Alexandra Elve
(74) *Attorney, Agent, or Firm*—Brinks Hofer Gilson & Lione

(57) ABSTRACT

A magnetic head includes a metal plate having a conductive pattern, and a slider having a head element and a connecting terminal electrically connected to the head element, and fixed on the metal plate. The connecting terminal and the conductive pattern are connected by ultrasonically bonding a ball bump thereto. The ball bump has on its surface a projecting portion extending in the direction that links the connecting terminal and the conductive pattern. A bonding capillary for use in the ultrasonic bonding includes a tip section having a through hole for passing a wire therethrough. The tip section also has a recessed portion centered on the through hole, and a groove that reaches the outer surface of the tip section across the center of the recessed portion.

1 Claim, 9 Drawing Sheets

MAGNETIC HEAD WITH BONDED BALLS HAVING A CAPILLARY MARK

BACKGROUND OF THE INVENTION

1. Field of the Invention

The present invention relates to a magnetic head, such as a thin-film magnetic head, which achieves improved bonding strength and stability of a ball bump for use in electrically connecting a connecting terminal of a head element and a conductive pattern for supplying an electric signal to the head element. The present invention also relates to a manufacturing method of the magnetic head, and to a bonding capillary used in the manufacturing method.

2. Description of the Related Art

FIG. 9 shows an overall configuration of a conventional thin-film magnetic head used in a hard magnetic disk device. The conventional thin-film magnetic head generally comprises a ceramic slider 1 having a head element formed of a thin film on its end face and serving to record on and reproduce information from a hard magnetic disk, a flexure 2 having flexibility and fixed at its leading end onto the underside of the slider 1 with an adhesive, an elastic load beam 3 made of stainless steel and fixed to the leading end of the flexure 2 by spot welding or the like, a mount 4 made of stainless steel and fixed to the rear and of the load beam 3 by spot welding or the like, a conductive pattern 8 mounted on the mount 4 so as to supply an electric signal to the head element, and a flexible wiring board 5 connected to the conductive pattern 8.

As shown in FIGS. 10 to 12, on an end face 1a of the slider 1 having a head element 6, four connecting terminals 7 (for recording and reproduction) made of gold-plated copper or nickel are arranged so as to establish an electrical connection with the head element 6. On the surface of the flexure 2, four conductive patterns 8, made of copper plated with gold via a polyimide resin layer, are formed, and the conductive patterns 8 are led out from the rear end of the flexure 2 to be electrically connected to the flexible wiring board 5.

The slider 2 is bonded to a tongue 2a formed at the leading end of the flexure 2. In this case, the end face 1a of the slider 1 and the surface of the flexure 2 are orthogonal to each other, and the four connecting terminals 7 of the slider 1 are placed close to the ends of the corresponding four conductive patterns 8. Ball bumps 10 made of gold or the like are ultrasonically bonded to a corner portion 9 between the connecting terminals 7 and the conductive patterns 8 where the end face 1a of the slider 1 and the surface of the flexure 2 intersect, thereby electrically connecting the connecting terminals 7 and the conductive patterns 8.

A projection 3a formed at the leading end of the load beam 3 is in contact with the underside of the tongue 2a of the flexure 2, and presses the flexure 2 having elasticity against the underside of the slider 1 at a predetermined pressure.

In the magnetic head, although not shown, the mount 4 and the slider 1 are mounted opposed to a drive arm of the hard magnetic disk device and a magnetic recording surface of the magnetic disk, respectively. During operation, the slider 1 fixed to the flexure 2 floats above the magnetic recording surface of the magnetic disk at a predetermined distance while following the flow of air because of flexibility of the flexure 2, whereby magnetic recording on and reproduction from the magnetic disk are performed by the head element 6.

Next, a description will be given of a method of manufacturing the above-described magnetic head, in particular, a method of bonding the connecting terminal 7 and the conductive pattern 8 by the ball bump 10. FIG. 13 is a side view of a bonding capillary 11 made of a high-density ceramic, such as ruby or alumina ($Al_2O_3$), FIG. 14 is an enlarged view showing the principal part of a tip section of the capillary 11, and FIG. 15 is an end view of the tip section of the capillary 11. The capillary 11 consists of a cylindrical body section 11b having a through hole 11a in its center, and a tip section 11c that tapers off toward one end thereof. The tip section 11c has a recessed portion 11d having a conical inner surface that communicates with an open end of the through hole 11a.

As shown in FIG. 16, a fine wire 12 made of gold is passed through the through hole 11a in the capillary 11, and the leading end of the wire 12 projecting from the end face of the tip section 11c is melted by electric discharge, thereby forming a ball 12a. The ball 12a is held by the recessed portion lid formed in the tip section 11c.

Next, the slider 1 fixed to the flexure 2 is held on a jig or the like (not shown) at an inclined angle of 45°, and the capillary 11 is lowered to face the corner portion 9 where the end face 1a of the slider 1 and the surface of the flexure 2 intersect, thereby bringing the ball 12a into contact with the surfaces of the connecting terminal 7 of the slider 1 and the conductive pattern 8 of the flexure 2. Then, the capillary 11 is ultrasonically vibrated in the direction parallel to the end face 1a of the slider 1 and the surface of the flexure 2 (orthogonal to the drawing sheet). Consequently, the ball 12a is simultaneously bonded to both the connecting terminal 7 and the conductive pattern 8, thereby forming a ball bump 10.

Finally, the wire 12 is pulled off the ball bump 10, and the electrical connection between the connecting terminal 7 and the conductive pattern 8 by the ball bump 10 is thereby completed. On the surface of the ball bump 10, a part of the severed wire 12, as shown in FIG. 17, remains as a residual portion 10a.

In the above-described conventional bonding method using the ball 12a, the end of the tip section 11c of the capillary 11 in the lowered position is prone to be displaced from the corner portion 9, where the end face 1a of the slider 1 and the surface of the flexure 2 intersect, due to variations in positioning accuracy or other causes. For example, when the end of the tip section 11c is displaced toward the conductive pattern 8 by a distance t, the ball 12a held in the recessed portion 11d of the tip section 11c undergoes ultrasonic bonding in such a displaced state. Therefore, the ball bump 10 is bonded without contact with the connecting terminal 7 or without stable bonding strength.

Moreover, even when the ball 12a is precisely positioned at the corner portion 9, since the contact surfaces between the ball 12a, and the connecting terminal 7 and the conductive pattern 8 are different in fractional force, the ball 12a rotates in the recessed portion 11d during bonding using ultrasonic vibration, which results in a prolonged bonding time, decreased bonding strength, etc.

SUMMARY OF THE INVENTION

The present invention has been made in view of the above-described problems. It is accordingly an object of the present invention to provide a magnetic head having a stable structure in which a connecting terminal and a conductive pattern are bonded by a ball bump with high bonding strength, a method of manufacturing the magnetic head, and a bonding capillary used in the method.

According to an aspect of the present invention, there is provided a magnetic head including a metal plate having a conductive pattern, and a slider fixed to the metal plate and having a head element and a connecting terminal electrically connected to the head element, wherein the connecting terminal and the conductive pattern are connected by ultrasonically bonding a metal ball thereto, and wherein a projecting portion is formed on the surface of the ball bump so as to extend in the direction that links the connecting terminal and the conductive pattern. In the above magnetic head, the projecting portion serves to prevent the ball bump from rotating during bonding, which allows a reliable magnetic head to be constructed in which a connecting terminal and a conductive pattern are bonded with high bonding strength.

According to another aspect of the present invention, there is provided a magnetic head manufacturing method including the steps of: fixing a slider having a head element and a connecting terminal electrically connected to the head element onto a metal plate having a conductive pattern; forming a groove in a tip section of a capillary having a through hole so as to cross the through hole, passing a wire through the through hole, and placing a ball formed at the end of the wire into the tip section; bringing the ball into contact with the connecting terminal and the conductive pattern by moving the tip section of the capillary; and forming a ball bump by ultrasonically vibrating the capillary in the direction orthogonal to the direction of the groove and bonding the ball to the connecting terminal and the conductive pattern. In this method, even when the tip section of the capillary is displaced, the ball held in the tip section is automatically placed by the groove at a predetermined position between the connecting terminal and the conductive pattern. Moreover, a part of the ball engages into the groove during welding, and the ball is thereby prevented from rotating, which permits firm bonding to be efficiently performed in a short time.

In the above-described magnetic head manufacturing method of the present invention, it is preferable that the value obtained by dividing the width of the groove by the diameter of the ball be greater than 1/6 and less than 1/2. In this case, more reliable bonding can be achieved.

According to a further aspect of the present invention, there is provided a bonding capillary wherein a tip section having a through hole for passing a wire therethrough is provided with a recessed portion centered on the through hole, and a groove that reaches the outer surface of the tip section across the center of the recessed portion. This bonding capillary permits increases in bonding strength and reliability.

Further objects, features and advantages of the present invention will become apparent from the following description of the preferred embodiment with reference to the attached drawings.

DESCRIPTION OF THE PREFERRED EMBODIMENT

A preferred embodiment of the present invention will now be described with reference to the attached drawings.

Figure 1:
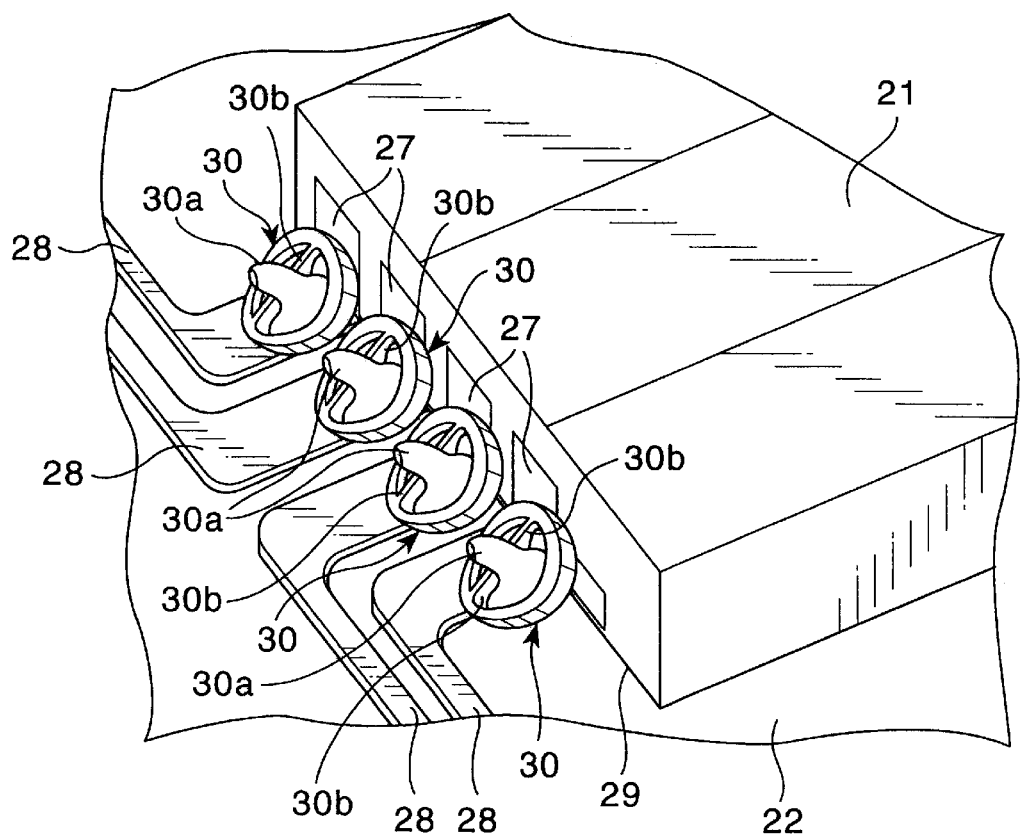
FIG. 1 is an enlarged perspective view showing the principal part of a magnetic head according to the present invention.

FIG. 1 is an enlarged perspective view showing the principal part of a magnetic head according to the present invention. A ceramic slider 21 is bonded with an epoxy adhesive or the like onto a surface of a flexible metal plate 22 made of stainless steel (e.g., a flexure), where four conductive patterns 28 are formed. Formed on one end face 21a of the slider 21 are a head element (not shown) and four connecting terminals 27 that are electrically connected to the head element. The conductive patterns 28 and the connecting terminals 27 correspond to each other, and are electrically connected by ultrasonically bonding ball bumps 30 to a corner portion 29 where the end face 21a of the slider 21 is at right angles to the surface of the metal plate 22. Each of the ball bumps 30 has on its surface a residual portion 30a that remains after a wire, which will be described later, is pulled off, and a projecting portion 30b extending on both sides of the residual portion 30a in the direction that links the connecting terminal 27 and the conductive pattern 28.

Although not shown, the metal plate 22 is welded to a load beam fixed to a mount, in a manner similar to the above-described conventional example. The mount allows the entire magnetic head to be assembled into a magnetic disk device.

Figure 2:
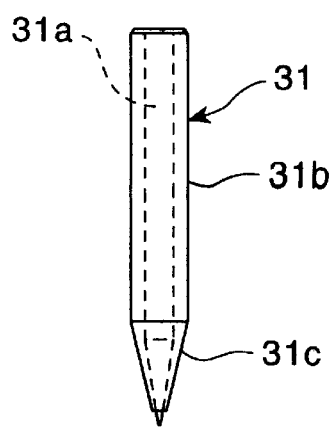
FIG. 2 is a side view of a capillary according to the present invention.
Figure 3:
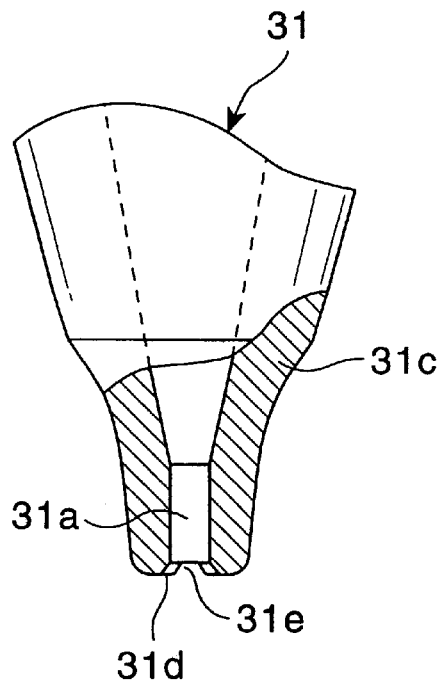
FIG. 3 is an enlarged sectional view showing the principal part of a tip section of the capillary shown in FIG. 2.
Figure 4:
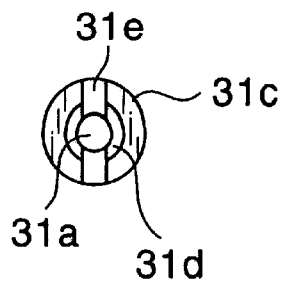
FIG. 4 is an end view of the tip section of the capillary.

FIGS. 2 to 4 show a bonding capillary 31 made of a high-density ceramic, such as ruby or alumina, that is employed in the present invention. This capillary 31, similarly to the conventional example, consists of a cylindrical body section 31b having a through hole 31a in its center, and a tip section 31c that tapers off toward one end thereof. The tip section 31c includes a recessed portion 31d having a conical inner face that communicates with the open end of the through hole 31a, and a linear groove 31e that reaches the outer peripheral surface of the tip section 31c across the center of the recessed portion 31d. The extending direction of the groove 31e is previously set to be orthogonal to the direction of vibration of the capillary 31.

While the bore of the through hole 31a in the tip section 31c varies depending on the form of the wire, it is set at, for example, approximately 40 μm to 50 μm The recessed portion 31d is countersunk toward the open end at a taper angle of approximately 90°. While the depth of the recessed portion 31d varies depending on the diameter of the ball bump 30, it is set at, for example, approximately 10 μm to 40 μm. The width of the groove 31e is approximately 30 μm to 50 μm. While the end of the tip section 31c at the outer peripheral edge, it may be tapered as necessary.

Figure 5:
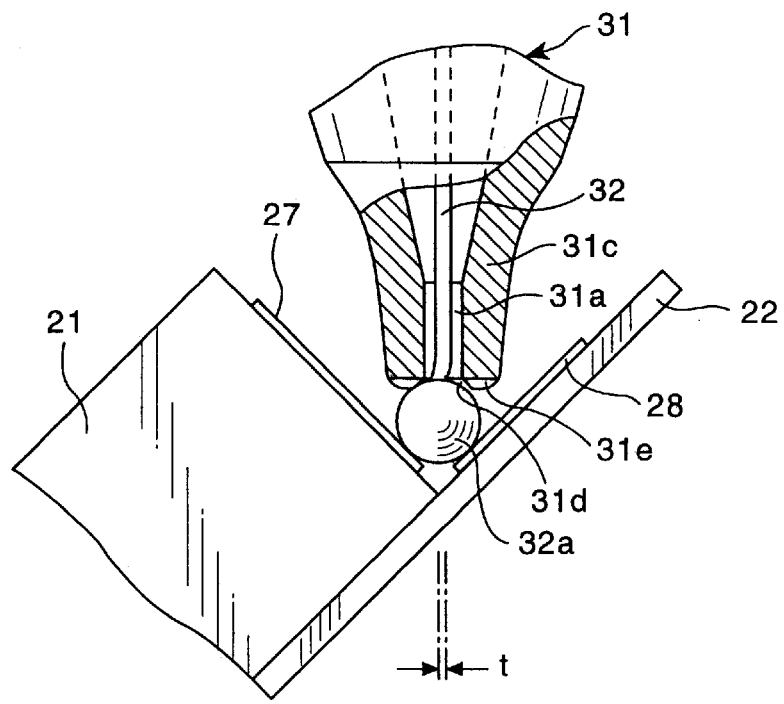
FIG. 5 is a cross-sectional view showing a bonding method using the capillary of the present invention.

With reference to FIG. 5, a description will be given of a method of connecting (bonding) the connecting terminal 27 of the slider 21 and the conductive pattern 28 of the metal plate 22 using the above-described capillary 31.

First, a fine wire 32 made of gold or the like is passed through the through hole 31a of the capillary 31, and one end of the wire 32 is melted by means of thermal energy produced by electric discharge or the like, thereby forming a ball 32a. The ball 32a is held by the recessed portion 31d formed in the tip section 31c of the capillary 31.

Next, the metal plate 22 provided with the slider 22 is placed on a jig or the like (not shown) at an inclined angle of 45°, and the capillary 31 is positioned so that the ball 32a lies at the corner portion 29 where the end face 21a of the slider 21 and the surface of the metal plate 22 intersect at right angles. Then, the capillary 31 is lowered toward the corner portion 29. In this case, the groove 31e formed in the tip section 31c is oriented to face both the surfaces of the connecting terminal 27 and the conductive pattern 28.

Next, the tip section 31c of the capillary 31 is ultrasonically vibrated in the direction parallel to the surfaces of the connecting terminal 27 and the conductive pattern 28 (perpendicularly to the drawing sheet), that is, in the direction orthogonal to the direction of the groove 31e of the tip section 31c. Thereby the ball 32a is ultrasonically bonded to the contact surfaces of the connecting terminal 27 and the conductive pattern 28 to form a ball bump 30. Consequently, an electrical connection between the connecting terminal 27 and the conductive pattern 28 is established.

Figure 6:
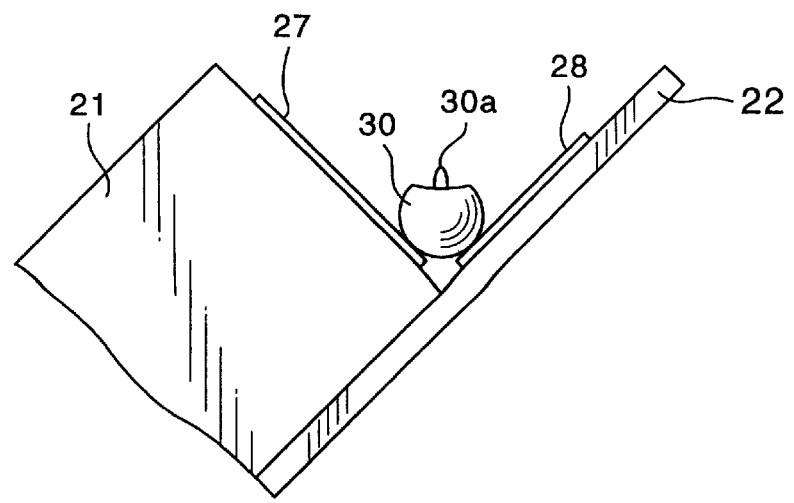
FIG. 6 is a cross-sectional view showing a bonding state of a ball bump according to the present invention.

At this bonding, even if the lowered position of the end of the tip section 31c is displaced by a distance t from the corner portion 29 due to variations in positioning accuracy, since the groove 31e decreases the force for holding the ball 32a at the recessed portion 31d of the tip section 31c in the direction toward the connecting terminal 27 and the conductive pattern 28, the ball 32a is automatically placed at the corner portion 29 along the surfaces of the connecting terminal 27 and the conductive pattern 28. As a result, it is possible to reliably bond the ball 32a with high positioning accuracy, and to thereby provide the ball bump 30, as shown in FIG. 6.

Furthermore, the upper side of the ball 32a deforms because of ultrasonic energy, and partially engages in the groove 31e of the tip section 31c. The rotation of the ball 32a is thereby prevented, which ensures efficient and stable bonding to the contact surfaces.

Finally, the capillary 31 is raised, so that the tip section 31c separates from the ball bump 30, and simultaneously, the wire 32 is pulled off the ball bump 30. Thereby the electrical connection between the connecting terminal 27 and the conductive pattern 28 is completed. As a result, the surface of the ball bump 30 is provided with the residual portion 30a of the severed wire 32, and the projecting portion 30b formed by the engagement of the ball 32a into the groove 31e, as shown in FIG. 1. The projecting portion 30b extends in the direction that links the connecting terminal 27 and the conductive pattern 28.

Figure 7A:
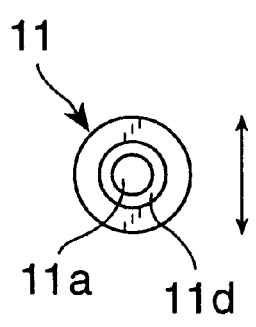
FIGS. 7A to 7D are end views showing the forms of tips of four types of capillaries used in bonding experiments.
Figure 7B:
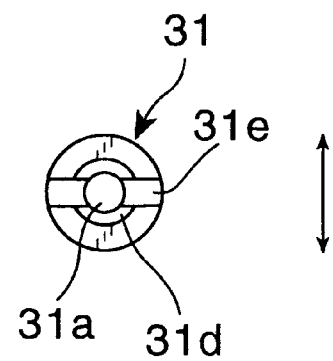
Figure 7C:
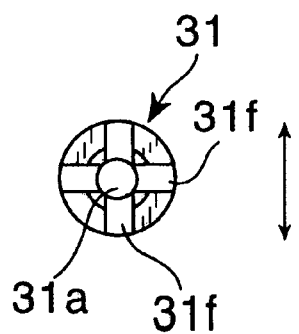
Figure 7D:
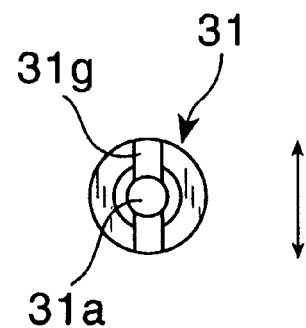

Experiments were conducted on advantages of the groove formed in the tip section of the capillary. The results of the experiments will now be described in connection with the embodiment of the present invention and comparative examples. FIGS. 7A to 7B are end views showing the shapes of tip sections of four types of capillaries. FIG. 7A shows a conventional example in which no groove is formed, FIG. 7B shows the embodiment of the present invention in which the groove 31e extends in the direction orthogonal to the direction of vibration of the capillary 31, FIG. 7C shows Comparative Example 1 in which a cross-shaped groove 31f is formed in the direction orthogonal to the vibrating direction of the capillary 31, and FIG. 7D shows Comparative Example 2 in which a groove 31g extends in the same direction as the vibrating direction of the capillary 31. In these experiments, the through holes 11a and 31a of the capillaries 11 and 31 are 46 μm in diameter, and the grooves 31e, 31f, and 31g are 30 μm in width.

The connecting terminal and the conductive pattern were bonded by ultrasonically vibrating, without heating from the outside, the capillaries having the above-described shapes with a ball held at the leading end thereof in the directions of the arrows in FIGS. 7A to 7D (up and down in the plane of the drawing), that is, in parallel with the connecting terminal and the conductive pattern. Thirty samples were produced for each of the capillaries, and the bonding properties of these samples were compared. The results of the comparisons are shown in the following Table 1:

TABLE 1

GROOVE SHAPE AND BONDING PROPERTIES

| Groove shape | Ball rotation prevention | Shear strength | Bonding positioning ease | Bonding positioning accuracy |
| --- | --- | --- | --- | --- |
| Conventional Example | C | B | B | A |
| Embodiment | A | A | A | A |
| Comparative Example 1 | A | C | C | C |
| Comparative Example 2 | B | C | C | C |

Figure 8:
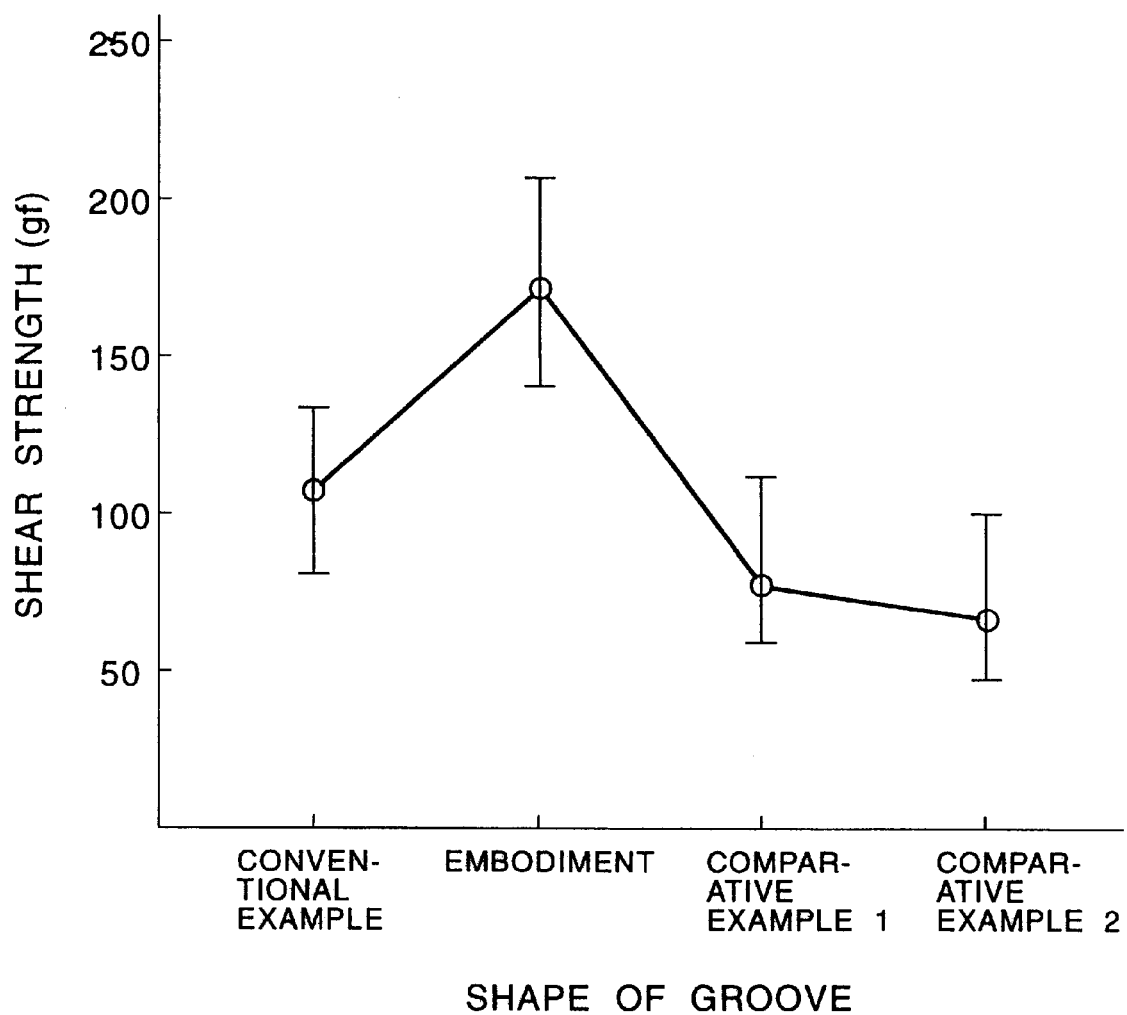
FIG. 8 is a graph showing the shear strengths depending on the tip forms of the capillaries as results of the bonding experiments.
Figure 9:
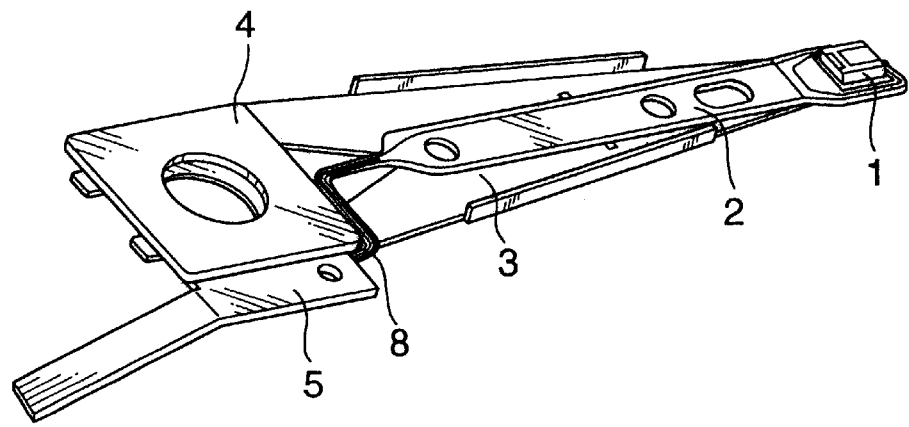
FIG. 9 is a perspective view of a conventional magnetic head.
Figure 10:
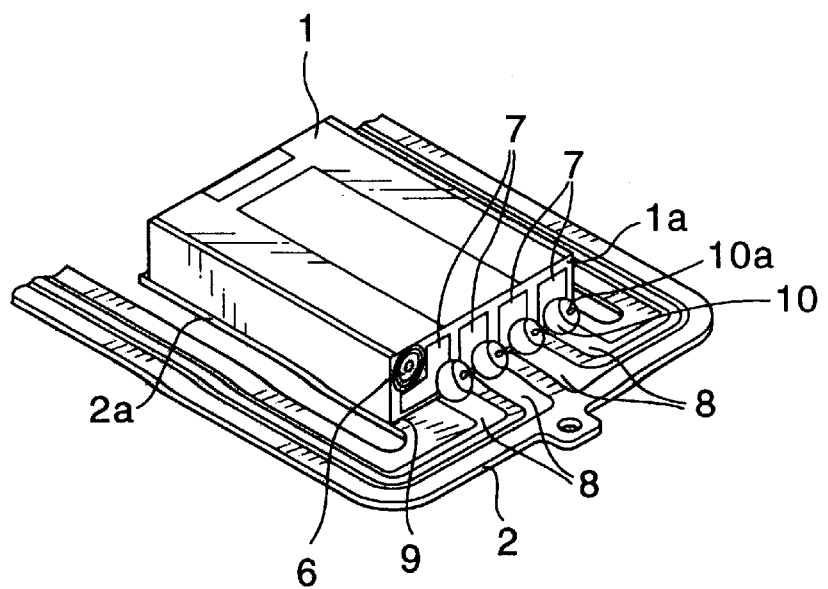
FIG. 10 is a perspective view showing the state of connection between a slider and a metal plate in the conventional magnetic head.
Figure 11:
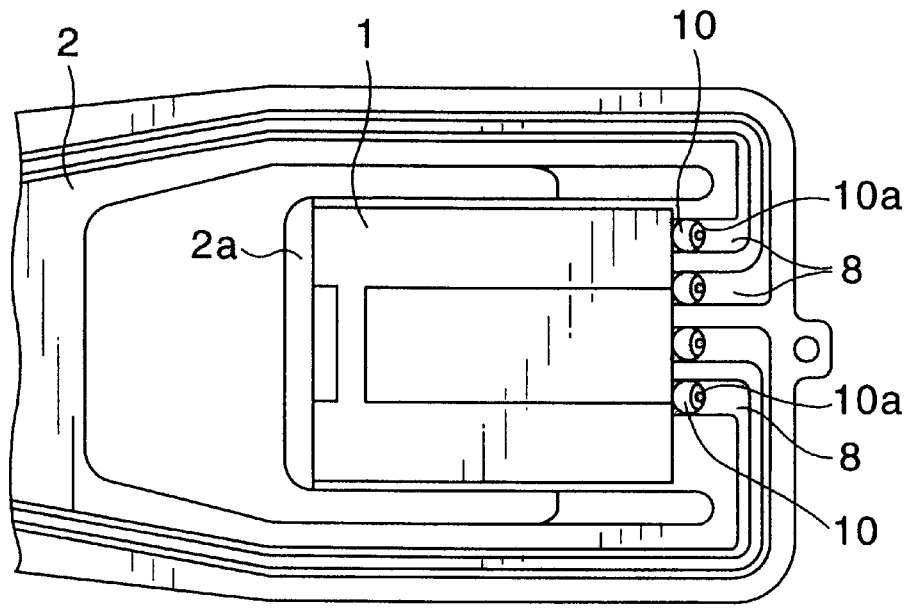
FIG. 11 is a plan view of the magnetic head shown in FIG. 10.
Figure 12:
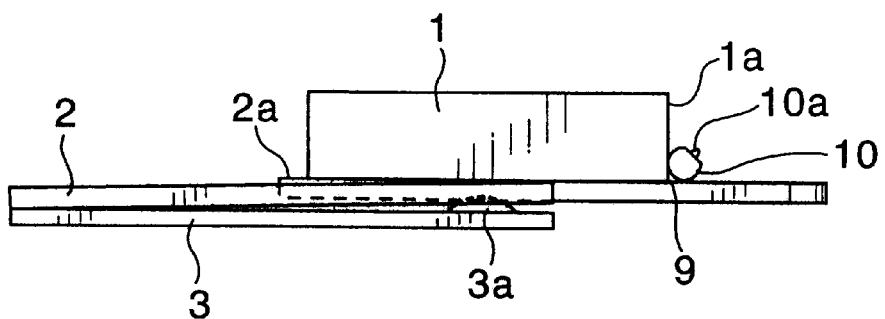
FIG. 12 is a side view of the magnetic head shown in FIG. 10.
Figure 13:
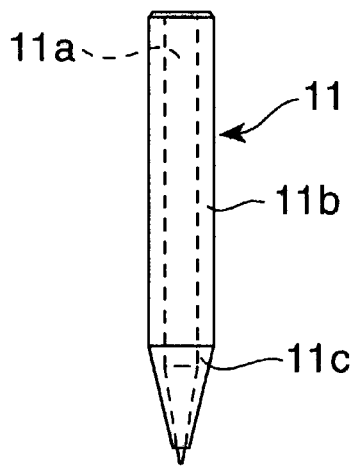
FIG. 13 is a side view of a conventional capillary.
Figure 14:
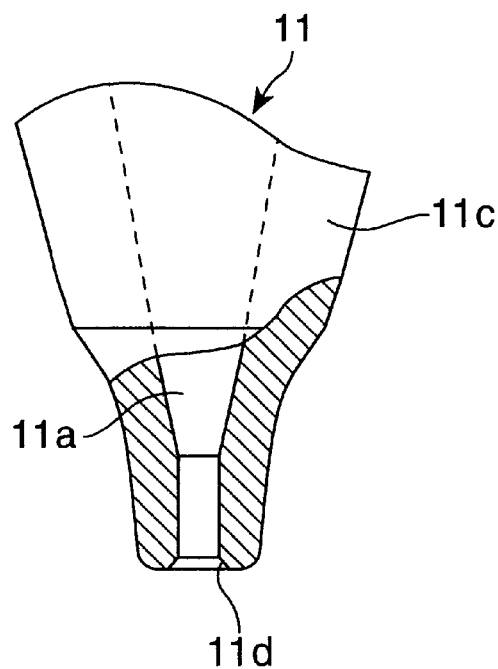
FIG. 14 is an enlarged sectional view showing the principal part of a tip section of the conventional capillary.
Figure 15:
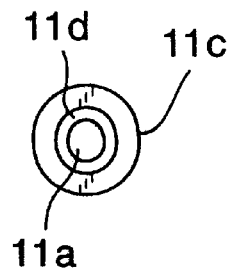
FIG. 15 is an end view of the tip section of the conventional capillary.
Figure 16:
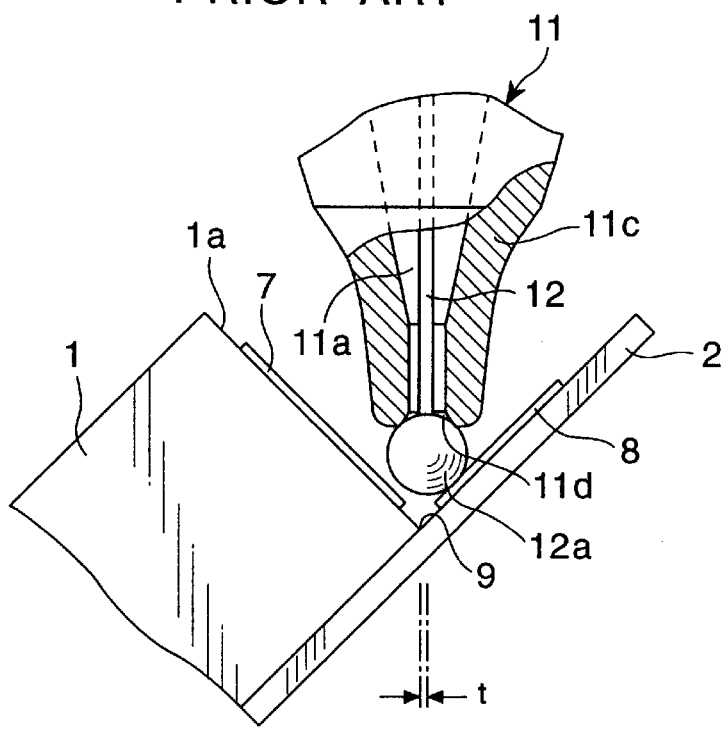
FIG. 16 is a cross-sectional view showing a bonding method using the conventional capillary.
Figure 17:
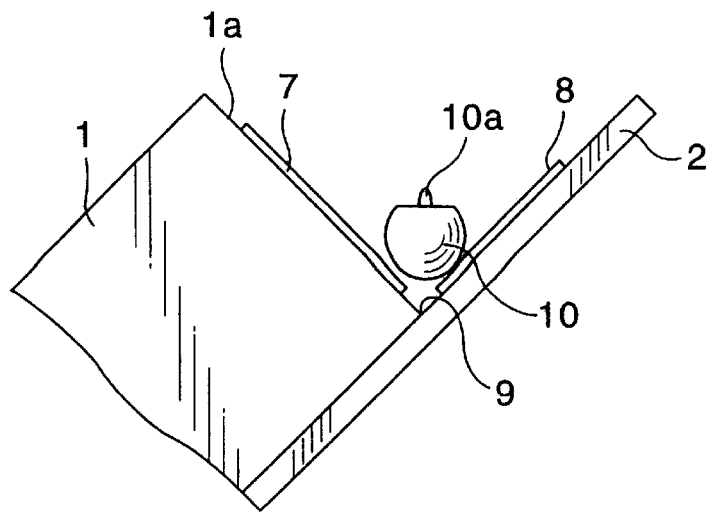
FIG. 17 is a cross-sectional view showing the bonding state of a conventional ball bump.

In Table 1, A indicates that the property is good, B indicates that the property is normal, and C indicates that the property is undesirable. The evaluation item "ball rotation prevention" was evaluated by visually observing the motion of the ball during bonding. "Shear strength" was evaluated by measuring the force (gf) applied in parallel to the bonding surface of the ball bump until the ball bump is severed. FIG. 8 is a graph showing the average shear strengths measured corresponding to the respective groove shapes. As this graph shows, the average shear strength in this embodiment of the present invention exhibits the highest value of 170 gf, which is about 1.7 times as high as that of the Conventional Example.

In Comparative Examples 1 and 2, a groove extends in the same direction as the vibrating direction of the capillary, and therefore, the ball retreats in the vibrating direction, that is, in the direction parallel to the connecting terminal and the conductive pattern. This can be considered as a cause of deterioration of the strength, ease of positioning, and positioning accuracy in bonding.

In addition, experiments were conducted on the relationship between bonding properties and grooves of varying widths that extend orthogonal to the vibrating direction of the capillary as in this embodiment shown in FIG. 7B. The experimental results are shown in the following Table 2. The diameter of the ball used in these experiments is 120 μm, and the width of the groove varies in steps of 10 μm, from 10 μm to 60 μm.

TABLE 2

GROOVE WIDTH AND BONDING PROPERTIES

| Groove width | Ball rotation prevention | Shear strength | Bonding positioning ease | Bonding positioning accuracy |
|---|---|---|---|---|
| 10 μm | C | B | B | A |
| 20 μm | B | B | B | A |
| 30 μm | A | A | A | A |
| 40 μm | XA | XA | A | A |
| 50 μm | A | A | A | A |
| 60 μm | A | B | A | C |

In Table 2, XA indicates that the property is very good, A indicates that the property is good, B indicates that the property is normal, and C indicates that the property is undesirable. In the case of the groove width of 10 μm, the "ball rotation prevention" property is substantially as undesirable as that of the conventional case in which the groove is not formed, because the width is too small. When the groove width is 60 μm, "bonding positioning accuracy" is low, because the width is too large and the ball retreats in the direction of the groove. The above results reveal that good properties can be achieved when the value obtained by dividing the groove width by the diameter of the ball is greater than 1/6 and less than 1/2.

While the present invention has been described with reference to what is presently considered to be the preferred embodiment, it is to be understood that the invention is not limited to the disclosed embodiment. The invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A magnetic head, comprising:

a metal plate having a conductive pattern; and a slider fixed on said metal plate and including a head element and a connecting terminal electrically connected to said head element, wherein said conductive pattern and said connecting terminal are connected by ultrasonically bonding a metal ball bump thereto, and wherein a projecting portion is formed on the surface of said ball bump so as to extend in the direction that links said conductive pattern and said connecting terminal.

* * * * *